(12) United States Patent
Ogihara et al.

(10) Patent No.: US 9,502,247 B2
(45) Date of Patent: Nov. 22, 2016

(54) METHOD FOR FORMING COATING FILM FOR LITHOGRAPHY

(71) Applicant: SHIN-ETSU CHEMICAL CO., LTD., Tokyo (JP)

(72) Inventors: Tsutomu Ogihara, Jyoetsu (JP); Taku Morisawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/078,820

(22) Filed: Mar. 23, 2016

(65) Prior Publication Data

US 2016/0300706 A1 Oct. 13, 2016

(30) Foreign Application Priority Data

Apr. 8, 2015 (JP) .................................. 2015-079618

(51) Int. Cl.
| | | |
|---|---|---|
| *H01L 21/00* | (2006.01) | |
| *H01L 21/027* | (2006.01) | |
| *B05C 11/08* | (2006.01) | |
| *G03F 7/00* | (2006.01) | |
| *B01D 65/02* | (2006.01) | |

(52) U.S. Cl.
CPC ............. *H01L 21/027* (2013.01); *B01D 65/02* (2013.01); *B05C 11/08* (2013.01); *G03F 7/0005* (2013.01); *B01D 2321/20* (2013.01)

(58) Field of Classification Search
CPC .... B01D 65/02; G03F 7/0005; H01L 21/027
See application file for complete search history.

(56) References Cited

U.S. PATENT DOCUMENTS

| | | | | |
|---|---|---|---|---|
| 9,201,301 | B2* | 12/2015 | Ogihara | .................. C08L 83/04 |
| 9,207,535 | B2* | 12/2015 | Ogihara | ............... C09D 183/06 |
| 2013/0108957 | A1 | 5/2013 | Iwabuchi et al. | |
| 2013/0108958 | A1 | 5/2013 | Ogihara et al. | |
| 2014/0335453 | A1 | 11/2014 | Ogihara et al. | |

FOREIGN PATENT DOCUMENTS

| | | |
|---|---|---|
| JP | 2013-092643 A | 5/2013 |
| JP | 2013-092686 A | 5/2013 |
| JP | 2014-219506 A | 11/2014 |

OTHER PUBLICATIONS

Umeda, Tow et al., "Wet particle source identification and reduction using a new filter cleaning process", Advances in Resist Materials and Processing Technology XXXI, Proceedings of SPIE, 2014, vol. 9051.

* cited by examiner

*Primary Examiner* — Richard Booth
(74) *Attorney, Agent, or Firm* — Oliff PLC

(57) ABSTRACT

The present invention provides a method for forming a coating film for a lithography, comprising the steps of: performing spin coating of a composition for forming a coating film for a lithography onto a substrate for producing a semiconductor device by using a spin coating device provided with an integrated filter in which a filtration membrane and a housing are integrated; and heating the substrate coated with the composition for forming a coating film for a lithography; thereby forming a coating film for a lithography on the substrate, wherein the integrated filter is a filter in which eluting material is in at amount of 3 mg or less per a filter, the eluting material being extracted by circulating an organic solvent at a rate of 10 ml/min for 24 hours. This method enables to form a coating film for a lithography with its coating defects extremely reduced.

16 Claims, 1 Drawing Sheet

METHOD FOR FORMING COATING FILM FOR LITHOGRAPHY

FIELD OF THE INVENTION

The present invention relates to a method for forming a coating film for a lithography which is used in microfabrication in a step for producing semiconductor devices and the like, especially for forming a resist upper layer film, a silicon-containing resist under layer film, an organic under layer film, and so on which are used in a multilayer resist method.

DESCRIPTION OF THE RELATED ART

As the LSI becomes highly integrated and achieves high-speed processing, the pattern size has been miniaturized rapidly. In relation to such miniaturization, lithography technologies accomplish fine patterning by adopting light sources with shorter wavelength and correspondingly selecting adequate resist compositions.

In miniaturization by using the same light source, however, if the pattern width is reduced with the thickness of the photoresist film unchanged, the aspect ratio of the developed photoresist pattern increases, resulting in a collapse of the pattern. Accordingly, the thickness of the photoresist film has been reduced in accordance with the progress of photoresist pattern miniaturization in order to keep the aspect ratio of the photoresist pattern within a proper range. As the reduction of the film thickness of the photoresist film proceeds, there arises another problem of processing failure of a substrate due to lack of durability to dry-etching.

The multilayer resist method is one of the methods to solve such a problem. In this method: a resist under layer film having a different etching selectivity from that of the photoresist film (resist upper layer film) intervenes between the resist upper layer film and the substrate to be processed; a pattern is formed in the resist upper layer film, and the pattern is transferred to the under layer film by dry etching, using the upper layer resist pattern as a dry etching mask; and this pattern is further transferred to the substrate to be processed by dry etching, using the under layer film as a dry etching mask.

On the occasion of applying a composition for forming a coating film for a lithography such as a resist upper layer film, a silicon-containing resist under layer film, and an organic under layer film onto a semiconductor device substrate and so on, microscopic roughness called a coating defect is generated. The coating defect contained in these coating film adversely affects formation of a pattern by a lithography, and causes a pattern defect. Further, if the pattern defect is transferred to the semiconductor device substrate by dry etching, a circuit on the semiconductor device induces an electrical fault such as an open fault and a short fault, and causes lowering of a production yield of a semiconductor device. In a three-layer process, which is one of a multilayer resist method, the following steps are performed, for example: onto a substrate to be processed an organic under layer film, a silicon-containing resist under layer film, and a resist upper layer film are laminated and formed in this order, then a pattern is formed in the resist upper layer film, and the pattern is transferred to the substrate to be processed by dry-etching. Accordingly, if any of the films contain the coating defect, a fault will be generated on a pattern transferred to a substrate to be processed. In order to avoid such a situation, an effective means is required to extremely suppress coating defects in each coating film for a lithography.

PRIOR ART DOCUMENTS

Patent Documents

Patent Document 1: Japanese Patent Laid-Open Publication No. 2013-92686
Patent Document 2: Japanese Patent Laid-Open Publication No. 2013-92643
Patent Document 3: Japanese Patent Laid-Open Publication No. 2014-219506

SUMMARY OF THE INVENTION

The present inventors have proposed filtration method and pre-treatment method for a filter of Patent Document 1 and Patent Document 2, as a method to reduce coating defects of an under layer film by extremely reducing foreign matters in a composition for forming a silicon-containing resist under layer film. Furthermore, the present inventors have a method for producing the composition by using a filtration membrane with low eluting material in Patent Document 3. In these methods, however, the effects for reducing coating defects are insufficient, and development of a method enables to further reduce coating defects is required.

The present invention was made in view of the problem mentioned above. The object of the present invention is to provide a method for forming a coating film for a lithography by using a composition for forming a coating film for a lithography with its coating defects extremely reduced.

To solve the problem mentioned above, the present invention provides a method for forming a coating film for a lithography, comprising the steps of: performing spin coating of a composition for forming a coating film for a lithography onto a substrate for producing a semiconductor device by using a spin coating device provided with an integrated filter in which a filtration membrane and a housing are integrated; and heating the substrate for producing a semiconductor device coated with the composition for forming a coating film for a lithography; thereby forming a coating film for a lithography on the substrate for producing a semiconductor device, wherein the integrated filter is a filter which brings eluting material in an amount of 3 mg or less per a filter when the eluting material is extracted by circulating an organic solvent at a rate of 10 ml/min for 24 hours.

Such a method enables to form a coating film for a lithography by using a composition for forming a coating film for a lithography with its coating defects extremely reduced.

As the integrated filter, it is preferred to use a filter which has been subjected to circulative cleaning by an organic solvent until the eluting material comes to be in an amount of 3 mg or less per a filter when the eluting material is extracted by circulating an organic solvent at a rate of 10 ml/min for 24 hours.

In the present invention, it is suitable to use an integrated filter which has been subjected to circulative cleaning as is described above, for example.

It is possible to perform the heating at a temperature of 200° C. or more.

The foregoing composition for forming a coating film for a lithography can be a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, or a composition for forming an organic under layer film.

The present invention is suitable for forming a coating film by using a composition for forming a coating film for a lithography as described above, for example.

It is also preferred for the filtration membrane to contain nylon, polyethylene, polypropylene, or polyfluorocarbon.

In the present invention, it is suitable to use the filtration membrane described above, for example.

As explained above, the method for forming a coating film for a lithography of the present invention enables to form a coating film for a lithography such as a resist upper layer film, a silicon-containing resist under layer film, and an organic under layer film with extremely reduced coating defects. This makes it possible to transfer a pattern with extremely reducing a defect when transferring a resist upper layer film pattern by dry-etching process in order of a silicon-containing resist under layer film and an organic under layer film in a three-layer process, for example. This finally enables to improve the production yield of a semiconductor device.

DETAILED DESCRIPTION OF THE PREFERRED EMBODIMENTS

Figure 1:
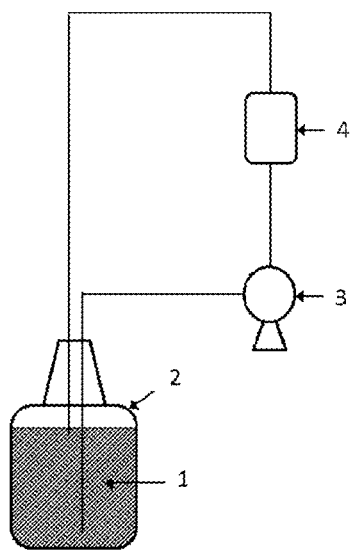
FIG. 1 is a schematic diagram of an example of circulative cleaning of an integrated filter applicable to the present invention.

As described above, previously, it has been trying to reduce coating defects by reducing foreign matters in a composition for forming a coating film during a production of the composition. Such a method alone, however, cannot sufficiently reduce coating defects.

This is presumed to be due to eluting material mixed in the composition when the composition is applied with a spin coating device provided with a filter, from which the eluting material generates. It has been known previously that the eluting material from a filter can be detected as a particle by SP3 defect inspection device manufactured by KLA-Tencor Corporation if the eluting material from a filter is applied to a silicon wafer (Proc. SPIE Vol. 9051 90511F (2014)). It has not been known, however, how the eluting material specifically affects a coating film for a lithography.

The inventors have investigated an influence of the eluting material from a filter on a coating film for a lithography, and thereby have found that the eluting material from a filter forms a coating defect in a coating film if it is mixed in the composition for forming a coating film for a lithography. In a pattern prior to a production decade of a semiconductor device of a half pitch of 45 nm, there occurred little influence to a production yield of a semiconductor device if there exists a coating defect due to the eluting material from a filter. However, the inventors of the present invention have found that in a production decade of more fine pitch than in the decade of a half pitch of 40 nm, the coating defect due to the eluting material from a filter comes to affect the production yield of a semiconductor device; especially in a lithography by a multilayer resist method using a coating film for a lithography such as a resist upper layer film used for an ArF liquid immersion exposure, an EUV (extreme-ultra violet) exposure, an electron beam drawing, a nano-imprinting lithography, and so on; a silicon-containing resist under layer film; and an organic under layer film; the production yield of a semiconductor device is largely affected by a coating defect due to the eluting material from a filter which is included in a coating device used for forming a coating film.

On the basis of the foregoing, the inventors have found that it is possible to form a coating film with its coating defects largely reduced by reducing eluting material from the filter which is included in a coating device used for applying a composition for forming a coating film for a lithography to form the film to a certain amount, and thereby have accomplished the present invention.

The present invention is a method for forming a coating film for a lithography, comprising the steps of: performing spin coating of a composition for forming a coating film for a lithography onto a substrate for producing a semiconductor device by using a spin coating device provided with an integrated filter in which a filtration membrane and a housing are integrated; and heating the substrate for producing a semiconductor device coated with the composition for forming a coating film for a lithography; thereby forming a coating film for a lithography on the substrate for producing a semiconductor device, wherein the integrated filter is a filter which brings eluting material in an amount of 3 mg or less per a filter when the eluting material is extracted by circulating an organic solvent at a rate of 10 ml/min for 24 hours.

Hereinafter, the present invention are specifically described, however, the present invention is not limited thereto.

<Spin Coating of a Composition>

In a method for forming a coating film for a lithography of the present invention, first, a composition for forming a coating film for a lithography is applied by spin coating onto a substrate for producing a semiconductor device using a spin coating device.

[Substrate for Producing a Semiconductor Device]

The substrate for producing a semiconductor device used for the present invention is not particularly limited, and any substrate ordinarily used for producing a semiconductor device can be used.

[Spin Coating Device]

The spin coating device used for a method for forming a coating film for a lithography of the present invention is provided with an integrated filter in which a filtration membrane and a housing are integrated, and the integrated filter is a filter which brings eluting material in an amount of 3 mg or less per a filter when the eluting material is extracted by circulating an organic solvent at a rate of 10 ml/min for 24 hours.

(Integrated Filter)

Regarding the integrated filter included in a spin coating device, although the reduction effect of coating defects is larger as the amount of eluting material per a filter is smaller, actually, it is impossible to make the amount of the eluting material to be zero, and substantially, sufficient effect can be obtained if the amount of the eluting material is 3 mg or less per a filter.

If the amount of the eluting material is more than 3 mg, in a resist upper layer film, a pattern defect, for example, partial crosslinking between exposed patterns in a bridge-like shape (bridge fault) or adhesion of the eluting material to a space between the patterns in case of the eluting material being insoluble to the developer is generated. In a silicon-containing resist under layer film, the eluting material, which is usually organic material and is totally different from a composition for forming a silicon-containing resist under layer film in the component element, is mixed therein, and acts to silanol which is extremely highly hydrophilic in a siloxane polymer to change the solvation state around the silanol, thereby makes the silanols to be condensed with each other to generate siloxane gel. This siloxane gel plays a main part to form a unevenness on a coating film for a lithography, which comes to be a coating defect. In an organic under layer film, the eluting material which is mixed in a composition for forming an organic under layer film hinders the cure reaction of the organic polymer contained therein, or low molecular weight eluting material is vaporized during a heat treatment or film formation to form a hole shape defect on a coated film, for example, and will produce a coating defect.

The origin of the eluting material is base materials for the filtration membrane of the integrated filter, the sacrifice component to form pores in the filtration membrane, the support material for the filtration membrane, the housing of the integrated filter, etc. These are mainly made from polyethylene or polypropylene, and the support material for the filtration membrane or housing of the integrated filter are mainly made from a resin such as polyolefin. Further, low molecular weight component generated in polymerization of polyethylene, polypropylene, and the like can be the eluting material. Accordingly, the eluting material from the filter is mainly hydrocarbons having 10 to 40 carbon atoms. In the present invention, an integrated filter in which these eluting material are reduced to a prescribed amount is used.

Illustrative examples of a material for the filtration membrane of the integrated filter include fluorocarbons, celluloses, nylons, polyesters, hydrocarbons, etc. Among them, the filtration membrane made from nylon, hydrocarbons such as polyethylene and polypropylene, a poly-fluorocarbon called Teflon (registered trade name) are preferable.

A method to extract eluting material through circulative cleaning by an organic solvent is mentioned as an example of the method to make the integrated filter to be a filter which brings eluting material in an amount of 3 mg or less per a filter when the eluting material being extracted by circulating an organic solvent at a rate of 10 ml/min for 24 hours.

FIG. 1 shows an example of a method for circulative cleaning of the integrated filter. In the method for circulative cleaning of FIG. 1, a container 2 containing a cleaning solvent 1, a pump 3, and an integrated filter 4 are connected, and the pump 3 makes the cleaning solvent 1 circulate to subject the integrated filter 4 to circulative cleaning. In the present invention, it is favorable to use an integrated filter which has been cleaned until the eluting material comes to be in an amount of 3 mg or less per a filter when the eluting material is extracted by circulating a cleaning solvent at a rate of 10 ml/min for 24 hours in such a method described above.

As organic solvents used for extracting the eluting material, ordinarily known organic solvents may be used, and specifically, illustrative examples thereof include, alcohols such as methanol, ethanol, propanol, butanol, methoxyethanol, butoxyethanol, methoxypropanol, and ethoxypropanol; ketones such as acetone, methyl ethyl ketone, and cyclohexanone; ethers such as tetrahydrofuran, dioxane, ethylene glycol dimethyl ether, diethylene glycol dimethyl ether; esters such as ethyl acetate, butyl acetate, ethyl lactate, ethyl cellosolve acetate, propylene glycol methylether acetate, and γ-butyrolactone; aromatic compounds such as benzene, toluene, and xylene; and chlorinated hydrocarbons such as dichloromethane, dichloroethane, dichloroethylene, and trichloroethylene. Among them, organic solvents without hydroxyl group are more favorable; for example, tetrahydrofuran, toluene, and dichloroethylene are particularly favorable.

These organic solvents enable to extract the eluting material such as hydrocarbon contained in the integrated filter, thereby reducing the eluting material extracted from the filter to a prescribed amount as described above. By using such an integrated filter in which eluting material extracted from the filter is reduced to a prescribed amount, in the spin coating device, the elution of the eluting material from the integrated filter into a composition for forming a coating film for a lithography can be suppressed, and as a result, the coating defects can be largely reduced.

<Heating of Substrate for Producing a Semiconductor Device>

Then, a coating film for a lithography is formed on the substrate for producing a semiconductor device by heating the substrate for producing a semiconductor device coated with a composition for forming a coating film for a lithography as described above. The heating can be performed at a temperature of, for example, 200° C. or more. In forming an organic under layer film, the heating is usually performed at a temperature of 200° C. or more, and in this heating, there occurs coating defect if the eluting material is mixed in the composition in some cases. On the other hand, in the present invention, the amount of the eluting material into the composition can be largely reduced, and therefore the generation of the coating defects can also be largely reduced when forming an organic under layer film.

It should be noted that the method for forming a coating film for a lithography of the present invention can be applied to formation of any coating film for a lithography used for an ArF liquid immersion exposure, an EUV exposure, double patterning, an organic solvent development, a nano-imprinting lithography, a directed self-assembly lithography, etc. However, a coating defect is particularly problematic in a decade when the fine processing is performed to form a pattern of a half pitch of 40 nm or less, particularly 30 nm or less. Particularly, in these processing decade, a multilayer resist method is applied as described above, and therefore it is favorable to apply the inventive method to form a coating film for a lithography used for a multilayer resist method in order to reduce the coating defects generated by this method. More specifically, the inventive method is favorable to be used for forming a coating film by using a composition for forming a resist upper layer film such as a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, a composition for forming an organic under layer film, etc.

As described above, the method for forming a coating film for a lithography of the present invention enables to form a coating film for a lithography such as a resist upper layer film, a silicon-containing resist under layer film, and an organic under layer film with its defects extremely reduced. This enables a pattern transfer with its defects extremely reduced when transferring a resist upper layer film pattern by using dry-etching process in order of a silicon-containing resist under layer film and an organic under layer film formed in a three-layer process, for example. This finally enables to improve the production yield of a semiconductor device.

EXAMPLE

Hereinafter, the present invention will be explained more specifically by showing Example and Comparative Example, but the present invention is not limited thereto.

Condition 1

Example 1

Cleaning Step

The First Round

A glass container containing 3 liters of cyclohexanone as a cleaning solvent for an integrated filter was connected with a pump and an integrated filter via fluororesin tubes as shown in FIG. 1. As the integrated filter, a POU (point-of use) filter in which a polyethylene filtration membrane with a mesh size of 5 nm (manufactured by Entegris, Inc.) had been integrated was attached, and then cyclohexanone was flowed at a rate of 10 mL/min with circulating for 24 hours. This cyclohexanone used for cleaning was analyzed by GC-MS (gas chromatograph-mass spectrometer), and it was found that hydrocarbons having 18 to 40 carbon atoms were contained. Then, this was concentrated, and 3.5 mg of non-volatile component was obtained.

Cleaning Step

The Second Round

Then, the cyclohexanone was replaced to new one, and circulated for 24 hours as is described above to extract the eluting material in the integrated filter. This cyclohexanone was concentrated, and 1.5 mg of non-volatile component was obtained.

Film Forming Step

The POU filter in which eluting materials had been removed by performing the first round of the cleaning step described above (i.e., the filter from which 1.5 mg of eluting material would be extracted in the second round of the cleaning step described above) was attached to Clean Track ACT-12 (manufactured by Tokyo Electron Ltd.). A composition for forming an organic under layer film (manufactured by Shin-Etsu Chemical Co. Ltd.) was introduced into the coating device and applied onto a silicon wafer with a diameter of 12 inches (300 mm), and then baked at 350° C. to form a coating film with a film thickness of 200 nm.

The number of coating defects of this coating film was measured using the SP3 defect detecting instrument (manufactured by KLA-Tencor Corp.). The number of the coating defects was 2 per a wafer.

Example 2

The POU filter in which eluting materials had been removed by performing the first round of the cleaning step described above (i.e., the filter from which 1.5 mg of eluting material would be extracted in the second round of the cleaning step described above) was attached to Clean Track ACT-12 (manufactured by Tokyo Electron Ltd.) as in Example 1. A composition for forming a silicon-containing resist under layer film (manufactured by Shin-Etsu Chemical Co. Ltd.) was introduced into the coating device and applied onto a silicon wafer with a diameter of 12 inches (300 mm), and then baked at 220° C. to form a coating film with a film thickness of 40 nm.

The number of coating defects of this coating film was measured using the SP3 defect detecting instrument (manufactured by KLA-Tencor Corp.). The number of the coating defects was 3 per a wafer.

Example 3

The POU filter in which eluting materials had been removed by performing the first round of the cleaning step described above (i.e., the filter from which 1.5 mg of eluting material would be extracted in the second round of the cleaning step described above) was attached to Clean Track Lithius (manufactured by Tokyo Electron Ltd.) as in Example 1. A composition for forming a resist upper layer film for an ArF immersion exposure (manufactured by Shin-Etsu Chemical Co. Ltd.) was introduced into the coating device and applied onto a silicon wafer with a diameter of 12 inches (300 mm), and then baked at 100° C. to form a coating film with a film thickness of 100 nm.

The number of coating defects of this coating film was measured using the SP3 defect detecting instrument (manufactured by KLA-Tencor Corp.). The number of the coating defects was 1 per a wafer.

Example 4

Condition 2

Cleaning Step

The First Round

The first round of the cleaning step described above was performed for 30 minutes as in Example 1. This cyclohexanone used for cleaning was analyzed by GC-MS, and it was found that hydrocarbons having 18 to 40 carbon atoms were contained. This was concentrated, and 0.6 mg of non-volatile component was obtained.

Cleaning Step

The Second Round

Then, the cyclohexanone was replaced to new one, and circulated for 24 hours as is described above to extract the eluting material in the integrated filter. This cyclohexanone was concentrated, and 3.0 mg of non-volatile component was obtained.

Film Forming Step

The POU filter in which eluting materials had been removed by performing the first round of the cleaning step described above (i.e., the filter from which 3.0 mg of eluting material would be extracted in the second round of the cleaning step described above) was attached to Clean Track ACT-12 (manufactured by Tokyo Electron Ltd.). A composition for forming an organic under layer film (manufactured by Shin-Etsu Chemical Co. Ltd.) was introduced into the coating device and applied onto a silicon wafer with a diameter of 12 inches (300 mm), and then baked at 350° C. to form a coating film with a film thickness of 200 nm.

The number of coating defects of this coating film was measured using the SP3 defect detecting instrument (manufactured by KLA-Tencor Corp.). The number of the coating defects was 8 per a wafer.

Comparative Example 1

The same POU filter that was used in Example 1 but without the foregoing cleaning steps (i.e., the filter from which 3.5 mg of eluting material would be extracted in the first round of the cleaning step in Condition 1 described above) was attached to Clean Track ACT-12, and then the same composition for forming an organic under layer film (manufactured by Shin-Etsu Chemical Co. Ltd.) that was used in Example 1 was introduced into the coating device and applied onto a silicon wafer with a diameter of 12 inches (300 mm), and then baked at 350° C. to form a coating film with a film thickness of 200 nm.

Figure 2:
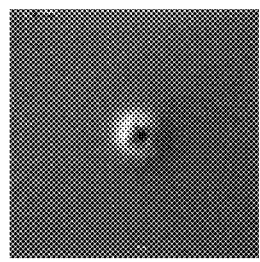
FIG. 2 is a scanning electron microscope photograph of a coating defect generated in the organic under layer film of Comparative Example 1.

The number of coating defects of this coating film was measured using the SP3 defect detecting instrument (manufactured by KLA-Tencor Corp.). The number of the coating defects was 52 per a wafer. FIG. 2 shows a scanning electron microscope photograph of a coating defect generated in this example. As shown in FIG. 2, a pit-like defect was generated, which is considered to be a trace where volatile hydrocarbons had vaporized. From this, it can be assumed that the eluting material is a cause of the coating defect.

Comparative Example 2

The same POU filter that was used in Example 1 but without the foregoing cleaning steps (i.e., the filter from which 3.5 mg of eluting material would be extracted in the first round of the cleaning step in Condition 1 described above) was attached to Clean Track ACT-12 (manufactured by Tokyo Electron Ltd.), and then the same composition for forming a silicon-containing resist under layer film (manufactured by Shin-Etsu Chemical Co. Ltd.) that was used in Example 2 was introduced into the coating device and applied onto a silicon wafer with a diameter of 12 inches (300 mm), and then baked at 220° C. to form a coating film with a film thickness of 40 nm.

Figure 3:
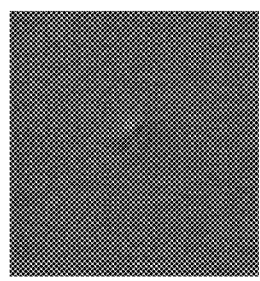
FIG. 3 is a scanning electron microscope photograph of a coating defect generated in the silicon-containing resist under layer film of Comparative Example 2.

The number of coating defects of this coating film was measured using the SP3 defect detecting instrument (manufactured by KLA-Tencor Corp.). The number of the coating defects was 109 per a wafer. FIG. 3 shows a scanning electron microscope photograph of a coating defect generated in this example. As shown in FIG. 3, an indeterminate form of defect was generated, in which so called gel state material was formed by an action of hydrocarbons with low polarity to toluene in the composition for forming a silicon-containing resist under layer film. From this, it can be assumed that the eluting material is a cause of the coating defect.

Comparative Example 3

The same POU filter that was used in Example 1 but without the foregoing cleaning steps (i.e., the filter from which 3.5 mg of eluting material would be extracted in the first round of the cleaning step in Condition 1 described above) was attached to Clean Track Lithius, and then the same composition for forming a resist upper layer film for an ArF immersion exposure (manufactured by Shin-Etsu Chemical Co. Ltd.) that was used in Example 3 was introduced into the coating device and applied onto a silicon wafer with a diameter of 12 inches (300 mm), and then baked at 100° C. to form a coating film with a film thickness of 100 nm.

Figure 4:
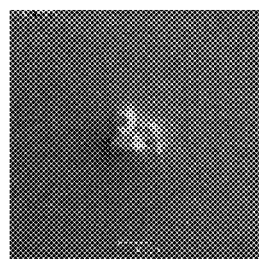
FIG. 4 is a scanning electron microscope photograph of a coating defect generated in the resist upper layer film for an ArF immersion exposure of Comparative Example 3.

The number of coating defects of this coating film was measured using the SP3 defect detecting instrument (manufactured by KLA-Tencor Corp.). The number of the coating defects was 15 per a wafer. FIG. 4 shows a scanning electron microscope photograph of a coating defect generated in this example. As shown in FIG. 4, an indeterminate form of defect was generated, which result from an action of hydrocarbons having low compatibility with polymethacrylate contained in the composition for forming a resist upper layer film for an ArF immersion exposure. From this, it can be assumed that the eluting material is a cause of the coating defect.

From the foregoing, it has been revealed that coating defects can be largely reduced when a coating film is formed by using a spin coating device provided with an integrated filter in which eluting material is extracted to a prescribed amount or less as the present invention.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for forming a coating film for a lithography, comprising the steps of: performing spin coating of a composition for forming a coating film for a lithography onto a substrate for producing a semiconductor device by using a spin coating device provided with an integrated filter in which a filtration membrane and a housing are integrated; and heating the substrate for producing a semiconductor device coated with the composition for forming a coating film for a lithography; thereby forming a coating film for a lithography on the substrate for producing a semiconductor device, wherein
the integrated filter is a filter which brings eluting material in an amount of 3 mg or less per a filter when the eluting material is extracted by circulating an organic solvent at a rate of 10 ml/min for 24 hours.

2. The method for forming a coating film for a lithography according to claim 1, wherein the integrated filter has been subjected to circulative cleaning by an organic solvent until the eluting material comes to be in an amount of 3 mg or less per a filter when the eluting material being extracted by circulating an organic solvent at a rate of 10 ml/min for 24 hours.

3. The method for forming a coating film for a lithography according to claim 1, wherein the heating is performed at a temperature of 200° C. or more.

4. The method for forming a coating film for a lithography according to claim 2, wherein the heating is performed at a temperature of 200° C. or more.

5. The method for forming a coating film for a lithography according to claim 1, wherein the composition for forming a coating film for a lithography is a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, or a composition for forming an organic under layer film.

6. The method for forming a coating film for a lithography according to claim 2, wherein the composition for forming a coating film for a lithography is a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, or a composition for forming an organic under layer film.

7. The method for forming a coating film for a lithography according to claim 3, wherein the composition for forming a coating film for a lithography is a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, or a composition for forming an organic under layer film.

8. The method for forming a coating film for a lithography according to claim 4, wherein the composition for forming a coating film for a lithography is a photosensitive resist composition which is photosensitive to EUV light or light having a wavelength of 200 nm or less, an electron beam sensitive resist composition, a directed self-assembly resist composition, a resist composition for a nanoimprint, a composition for forming a silicon-containing resist under layer film, or a composition for forming an organic under layer film.

9. The method for forming a coating film for a lithography according to claim 1, wherein the filtration membrane contains nylon, polyethylene, polypropylene, or polyfluorocarbon.

10. The method for forming a coating film for a lithography according to claim 2, wherein the filtration membrane contains nylon, polyethylene, polypropylene, or polyfluorocarbon.

11. The method for forming a coating film for a lithography according to claim 3, wherein the filtration membrane contains nylon, polyethylene, polypropylene, or polyfluorocarbon.

12. The method for forming a coating film for a lithography according to claim 4, wherein the filtration membrane contains nylon, polyethylene, polypropylene, or polyfluorocarbon.

13. The method for forming a coating film for a lithography according to claim 5, wherein the filtration membrane contains nylon, polyethylene, polypropylene, or polyfluorocarbon.

14. The method for forming a coating film for a lithography according to claim 6, wherein the filtration membrane contains nylon, polyethylene, polypropylene, or polyfluorocarbon.

15. The method for forming a coating film for a lithography according to claim 7, wherein the filtration membrane contains nylon, polyethylene, polypropylene, or polyfluorocarbon.

16. The method for forming a coating film for a lithography according to claim 8, wherein the filtration membrane contains nylon, polyethylene, polypropylene, or polyfluorocarbon.

* * * * *